Figure 1:
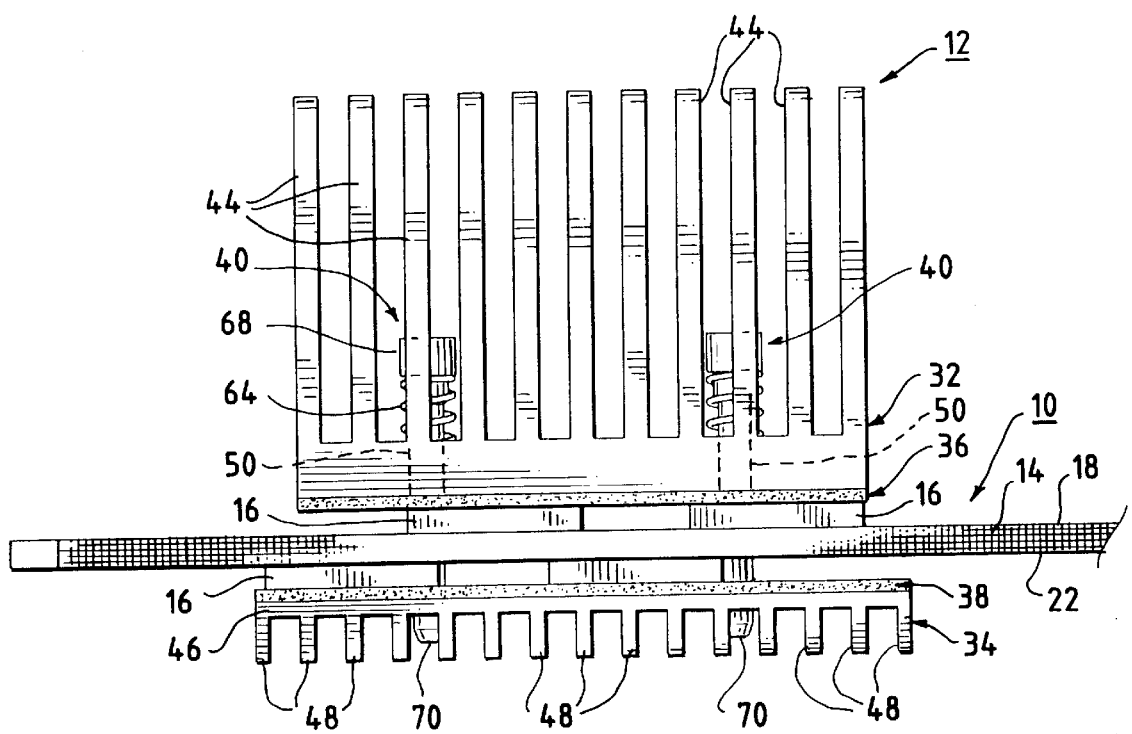
Figure 2:
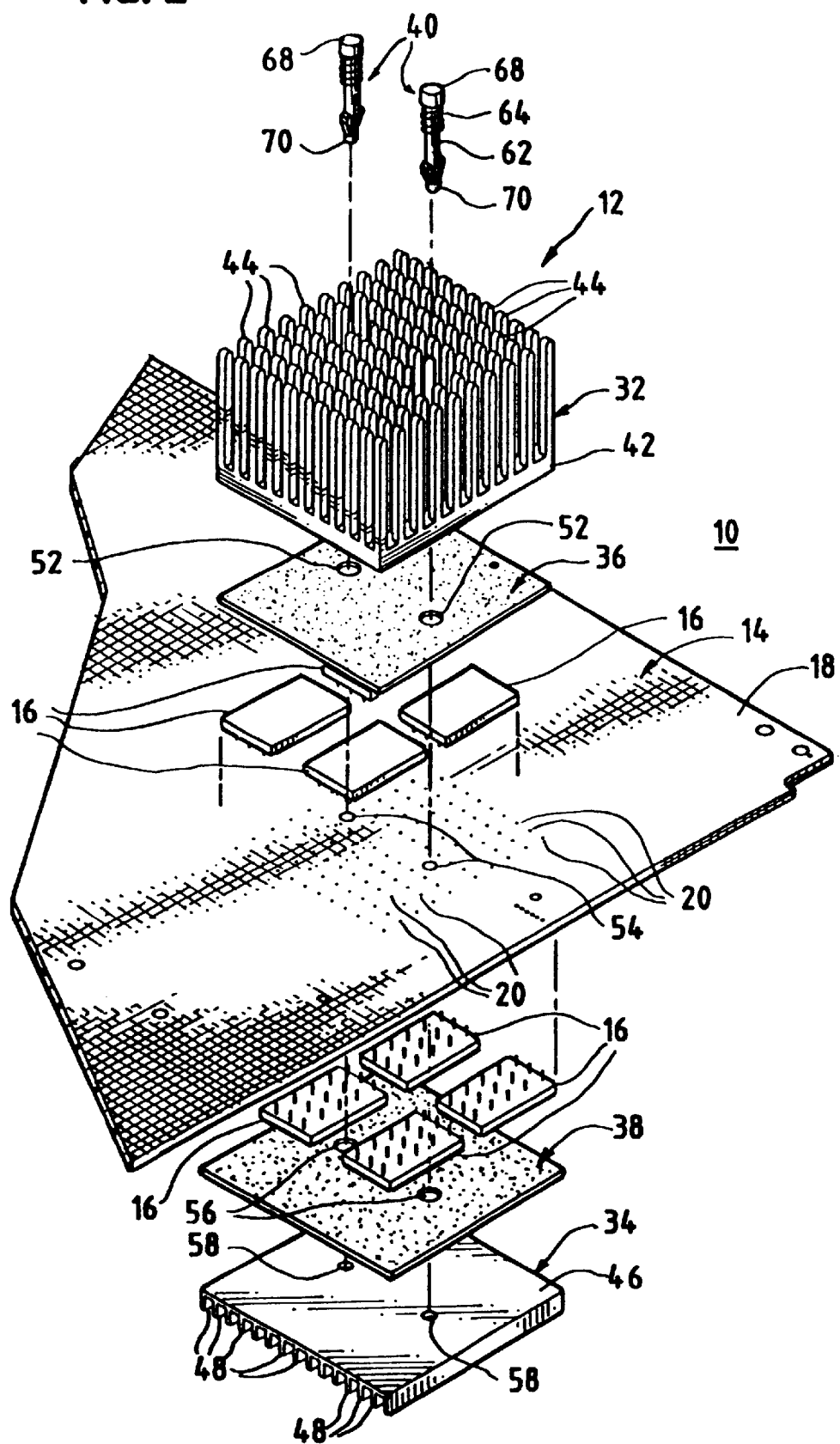
Figure 3:
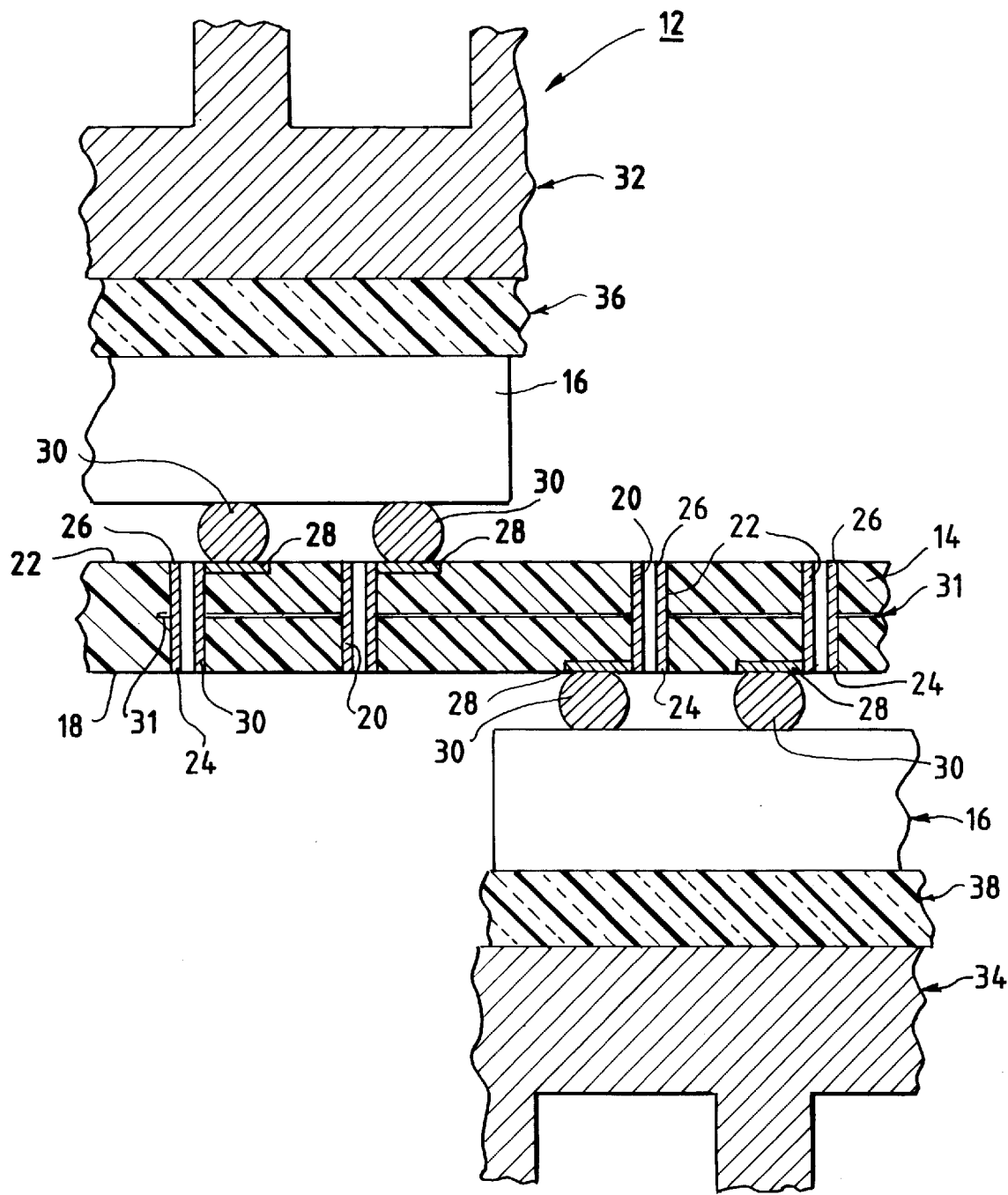

United States Patent [19]

Hamilton et al.

[11] Patent Number: 5,978,223
[45] Date of Patent: Nov. 2, 1999

[54] DUAL HEAT SINK ASSEMBLY FOR COOLING MULTIPLE ELECTRONIC MODULES

[75] Inventors: Roger Duane Hamilton, Eyota; Sukhvinder Singh Kang, Rochester, both of Minn.

[73] Assignee: International Business Machines Corporation, Armonk, N.Y.

[21] Appl. No.: 09/020,615

[22] Filed: Feb. 9, 1998

[51] Int. Cl.$^6$ ....................................................... H05K 7/20
[52] U.S. Cl. ......................... 361/704; 165/80.3; 165/185; 174/16.3; 257/718; 361/710; 361/715; 361/719
[58] Field of Search .................................. 165/80.2, 80.3, 165/185; 174/16.3; 257/706–707, 712–713, 717–719, 720, 727; 361/704, 707, 709–710, 715, 719–721

[56] References Cited

U.S. PATENT DOCUMENTS

| | | |
|---|---|---|
| 3,093,027 | 6/1963 | Rapata . |
| 4,774,632 | 9/1988 | Neugebauer ............................. 361/715 |
| 5,109,318 | 4/1992 | Funari et al. ............................ 361/710 |
| 5,172,301 | 12/1992 | Schneider . |
| 5,285,347 | 2/1994 | Fox et al. ................................ 361/385 |
| 5,285,350 | 2/1994 | Villaume ................................. 361/690 |
| 5,353,863 | 10/1994 | Yu ......................................... 165/80.3 |
| 5,370,178 | 12/1994 | Agonafer et al. ....................... 165/137 |
| 5,384,940 | 1/1995 | Soule et al. .............................. 24/453 |
| 5,467,251 | 11/1995 | Katchmar . |
| 5,646,826 | 7/1997 | Katchmar . |
| 5,703,752 | 12/1997 | Woo . |
| 5,710,733 | 1/1998 | Chengson et al. ...................... 257/719 |
| 5,730,210 | 3/1998 | Kou ........................................ 165/80.3 |

OTHER PUBLICATIONS

U.S. application No. 08/915,059, Filed Aug. 20, 1997, Entitled Heat Sink Assembly For Cooling Electronic Modules, by Butterbaugh et al., IBM Docket No. (RO997–098).
Brochure entitled "T–flex 200 Series" by Thermagon, Inc. No Known date.

*Primary Examiner*—Gregory Thompson
*Attorney, Agent, or Firm*—Joan Pennington; Matthew J. Bussan

[57] ABSTRACT

An assembly is provided for cooling a plurality of electrical modules mounted on the top and bottom surfaces of a circuit board. The circuit board includes an array of vias extending between the top and bottom surfaces of the circuit board. Each electrical module includes a plurality of leads, each lead being attached to a conductive region on the surface of the circuit board connected to one of the vias. The assembly of the invention includes a first metal heat sink and a second metal heat sink on opposite sides of the circuit board, each aligned with the multiple modules. A plurality of mounting elements attaches the first and second heat sinks together. A respective one of a pair of thermally conductive elements contacts the top surface of each electrical module and a respective heat sink for conducting heat from the modules to the heat sinks. A push pin assembly is used for mounting the first and second heat sinks together.

13 Claims, 4 Drawing Sheets

DUAL HEAT SINK ASSEMBLY FOR COOLING MULTIPLE ELECTRONIC MODULES

RELATED APPLICATION

The present invention relates to U.S. Pat. No. 5,870,286 filed Aug. 20, 1997, issued Feb. 9, 1999, by Matthew A. Butterbaugh, Roger D. Hamilton, and Sukhvinder S. Kang, entitled HEAT SINK ASSEMBLY FOR COOLING ELECTRONIC MODULES (R0997-098) and assigned to the present assignee. The subject matter of the above identified patent application is incorporated herein by reference.

FIELD OF THE INVENTION

The present invention relates to improvements in heat sink assemblies for cooling electronic modules mounted on a circuit board.

DESCRIPTION OF THE RELATED ART

Electronic modules include numerous circuits operating at high speed and generate substantial heat. In many applications, it is necessary to cool the modules in order to maintain specified temperatures and assure that the modules function properly and reliably. In the past, various approaches have been used to cool electronic modules.

With electronic modules such as memory chips, an array of many discrete chips may be mounted to the opposing surfaces of a single circuit board. For example, high performance multi-processor CPU cards require large amounts of cache memory in close proximity of the processor chips. The cache memory in the form of multiple static random access memory (SRAM) modules is best deployed on both sides of the processor circuit card to minimize the distance from the processor modules to achieve fast data transfer rates. Multiple processor circuit cards are stacked close to each other for performance reasons also with more vertical space provided above the side with the processor modules to enable air cooling of the processor chips. These constraints make it difficult to cool the compact array of cache SRAM modules, particularly those on the back side of the card where the vertical space is limited. Individual heat sinks could be attached to each SRAM module. Individual heat sinks impose a high manufacturing cost, significantly limit cooling capacity, and increase the difficulty and cost of SRAM rework processes.

SUMMARY OF THE INVENTION

A principal object of the present invention is to provide an improved dual heat sink assembly for cooling of multiple electronic modules mounted on both sides of a circuit board. Other objects of the invention are to provide a dual heat sink assembly that minimizes parts and labor assembly costs, that does not apply stress to component leads and does not interfere with access to components for rework and that overcomes disadvantages of prior art arrangements.

In brief, there is provided an assembly for cooling a plurality of electrical modules mounted on the top and bottom surfaces of a circuit board. The circuit board includes an array of vias extending between the top and bottom surfaces of the circuit board. Each electrical module includes a plurality of leads, each lead being attached to a conductive region on the surface of the circuit board connected to one of the vias. The assembly of the invention includes a first metal heat sink and a second metal heat sink on opposite sides of the circuit board, each aligned with the multiple modules. A plurality of mounting elements attaches the first and second heat sinks together. A respective one of a pair of thermally conductive elements contacts the top surface of each electrical module and a respective heat sink for conducting heat from the modules to the heat sinks.

In accordance with a feature of the invention, a push pin assembly is used for mounting the first and second heat sinks together.

BRIEF DESCRIPTION OF THE DRAWINGS

The present invention together with the above and other objects and advantages may best be understood from the following detailed description of the preferred embodiment of the invention illustrated in the drawings, wherein:

FIG. 1 is a side elevational view of a circuit board and electronic module assembly including a heat sink assembly embodying the present invention;

FIG. 2 is an exploded isometric view of the components of the circuit board and electronic module assembly of FIG. 1;

FIG. 3 is a greatly enlarged fragmentary vertical sectional view of part of the circuit board and electronic module assembly of FIG. 1;

FIG. 4 is an enlarged side elevational view of one of the heat sink mounting push pins of the assembly of FIG. 1; and FIG. 5 is an exploded isometric view of the push pin and its associated spring.

DETAILED DESCRIPTION OF THE PREFERRED EMBODIMENTS

Having reference now to the drawings, in FIGS. 1 and 2, there is illustrated a circuit board and electronic module assembly generally designated as 10 including a module cooling assembly generally designated as 12 embodying the principles of the present invention. In general, the electronic module assembly 10 includes a circuit board or card 14 and a plurality of modules 16 mounted upon the top surface 18 and a plurality of modules 16 mounted upon the bottom surface 22 of the board 14. In the illustrated embodiment an array of four modules 16 is mounted on both sides 18 and 22 of the circuit board 14, however the principles of the invention can be employed with arrays of more or fewer modules on either or both sides of the circuit board.

Elements of the electronic module assembly 10 are illustrated in more detail in FIG. 3. The circuit board 14 is formed of an electrically insulating material such as fiberglass and includes a plurality of vias 20 each extending from the top surface 18 to the bottom surface 22 of the board. The vias 20 are tubular, cylindrical segments of conductive metal, normally copper. As shown in FIG. 3, a lower end 24 of each via is exposed at the bottom surface 22 of the board 14. An upper end 26 of each via is exposed at the top surface 18 of the board 14. A conductive copper region or contact pad 28 is in electrical contact with each via 20 and an electrical lead 30. The circuit board 14 includes other conductive regions and layers including internal layers, such as a copper trace 31 selectively contacting the vias 20, that can assist in heat transfer through the circuit board 14.

The modules 16 may, for example, be static random access memory (SRAM) chips in the form of plastic ball grid array or PBGA modules having numerous electrical leads 30. One example of a BGA module has 119 leads in a seven by seventeen rectangular array with a lead to lead spacing of 0.050 inch, although the invention can be used with many other configurations and module types. The vias 20 and contact pads 28 are arrayed to correspond to the array of leads 30 and there is one via 20 and contact pad 28 for each lead 30. The leads 30 are in the form of balls of solder. The modules 16 are mounted to the top surface of the circuit board 16 by melting or reflowing the solder of the leads 30 to form an electrical connection and mechanical attachment between each lead 30 and its corresponding contact pad 28. Conductive layers or regions of the circuit board 14 selectively contact the vias 20 or the pads 28 and provide paths for signal, ground and power connections to the modules 16.

Heat is generated by the operation of the electrical elements within the modules 16. In the illustrated embodiment of the invention, the electronic module cooling assembly 12 removes heat from the modules to maintain the temperatures of the modules within a specified operating range to assure consistent and reliable module performance and life.

In accordance with feature of the invention, the electronic module cooling assembly 12 is arranged to maximize the heat sink surface area available to draw heat from each module 16 and to minimize the card area allocated for heat sink attachment purposes. In general, the cooling assembly 12 includes a first heat sink 32, a second heat sink 34, a first thermally conductive element 36, a second thermally conductive element 38 and mounting elements in the form of push pin assemblies 40 for attaching the heat sink 32 to the second heat sink 34. The thermally conductive elements 36 and 38 are provided for conducting heat from the electronic modules 16 to the respective first and second heat sinks 32 and 34. The heat sinks 32 and 34 cool multiple modules 16 on each side 18 and 22 of the circuit board or card 14. The heat sinks 32 and 34 are mechanically held in place using the spring loaded push pin assemblies 40 such that the heat sink 32 of the top or front side of the card 14 clamps to the heat sink 34 on the bottom or back side of the card to form a clamshell around the array of modules 16. The thermally conductive elements 36 and 38 are formed of a deformable thermal interface material arranged to make up dimensional tolerances in the height and planarity of the modules 16. The use of two heat sinks 32 and 34 to cool the arrays of modules 16 provides lower manufacturing cost and complexity as compared to individual heat sinks for each module 16. Since each heat sink 32 and 34 spans the space between adjacent modules 16, a larger amount of cooling surface area is provided. The push pin assemblies 40 mechanically clamp the heat sinks 32 and 34 together and are easily removed for card rework as needed. The push pin assemblies 40 attach the heat sinks 32 and 34 directly together so that the mechanical attachment of the modules 16 to the contact pads 28 is not required to support the mass of the heat sinks 32 and 34 in addition to the mass of the module 16.

Both heat sinks 32 and 34 are made of a thermally conductive metal, such as aluminum. The first heat sink 32 includes a base 42 and numerous fins 44 to provide a large surface area for the dissipation of heat. Preferably each of the fins 44 is arranged as a unitary post so that air flow is permitted through the fins 44 in multiple directions. The second heat sink 34 includes a base 46 and numerous fins 48 similarly to provide a large surface area for the dissipation of heat. The fins 48 in the form of outwardly extending plates oriented parallel to one another and parallel to the flow of cooling air within an enclosure. It should be understood that either or both heat sinks 32 and 34 could have a different size, smaller or larger, and could be arranged with fins 44 or 48 depending upon the available space and heat dissipation requirements. In the illustrated embodiment, the larger heat sink 32 can provide additional cooling for the modules 16 mounted on the lower surface 22 of the circuit board 14 that are primarily cooled by the smaller heat sink 34. This additional cooling is provided by the vias 20 and the copper traces 31 that enable heat transfer through the circuit board 14.

A pair of mounting holes 50 are formed in the heat sink 32. Each of the thermally conductive elements 36 and 38 and the circuit board 14 is provided with corresponding mounting holes 52, 54, and 56 and the heat sink 34 is provided with a pair of mounting holes 58 in the same pattern. To mount the heat sink 32 onto the heat sink 34, the holes 50 are aligned with the board holes 52, thermally conductive element holes 54 and 56 and the second heat sink holes 58 and the push pin assemblies 40 are inserted in a downward direction through the aligned holes 50, 52, 54, 56 and 58. The push pin assemblies 40 resiliently bias the heat sink 32 toward the base 46 of the heat sink 34.

In the illustrated embodiment, each of the thermally conductive elements 36 and 38 is a planar, conformable, soft, elastic, electrically insulating and thermally conductive interface pad sandwiched between the top surfaces of the modules 16 and the respective heat sinks 32 and 34. A suitable material is T-FLEX 240 (200 SERIES) Thermally Conductive Conformable Gap Filler sold by Thermagon, Inc., 3256 West 25th Street, Cleveland, Ohio 44109-1668. Information about this material may be found at the web site www.thermagon.com.

Alternatively, each of the thermally conductive elements 36 and 38 can be provided with an electrically insulating and thermally conductive, conformable gel or flowable material that is dabbed or squirted onto the top surfaces of the multiple modules 16. Then the thermally conductive elements 36 and 38 are formed in place when the modules 16 carrying the thermally conductive, conformable, flowable material are assembled with the respective first and second heat sinks 32 and 34. Such a suitable material is a thermally conductive silicone encapsulate material sold under the trademark THERM-A-FORM D-642 by Chomatics, of Woburn, Mass.

Figure 4:
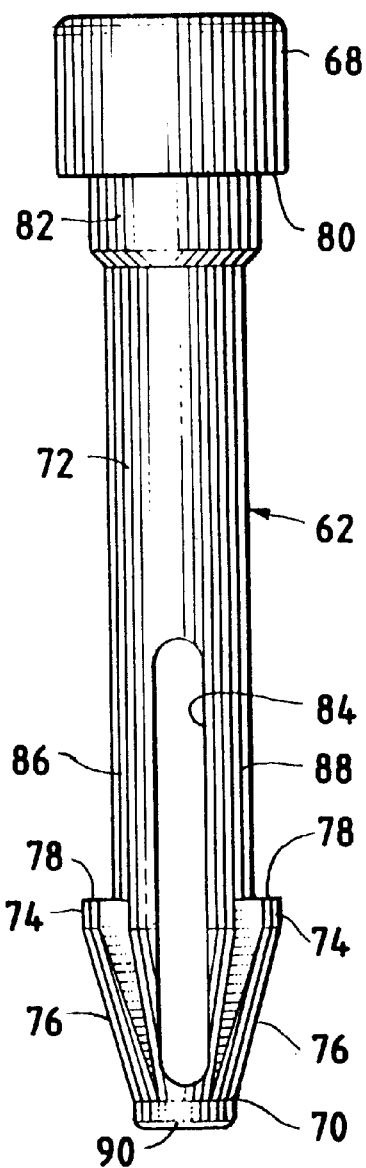
Figure 5:
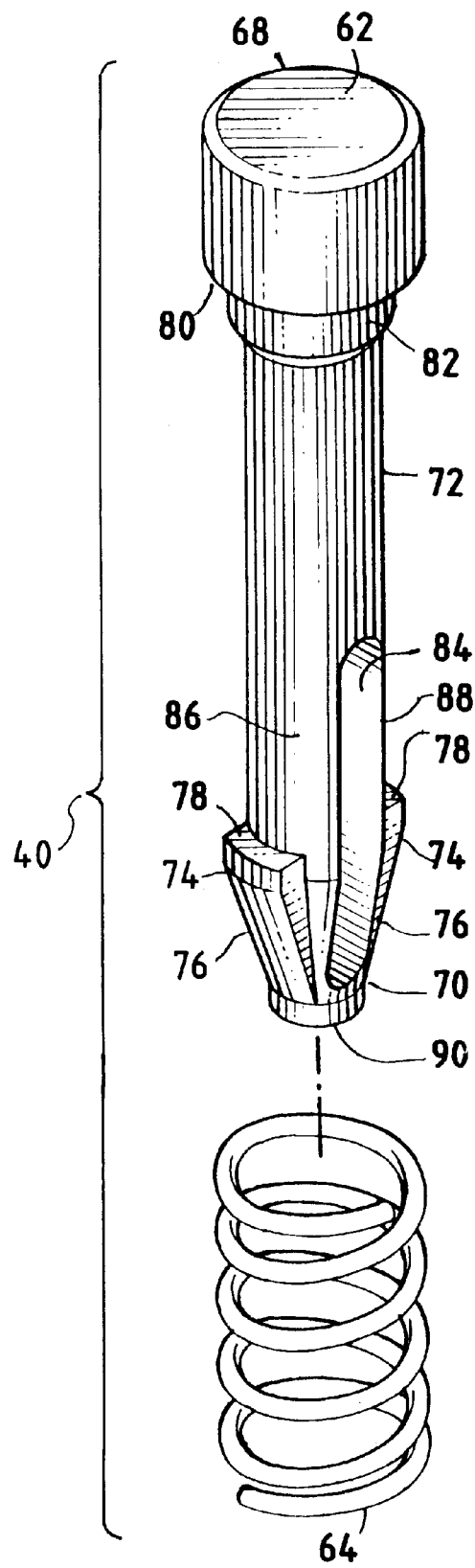

FIGS. 4 and 5 illustrate one of the push pin assemblies 40. It includes a pin body 62 formed of a molded plastic material and a spring 64. The body 62 is a unitary, one-piece, homogeneous molded part having a push head 68 at one end and a point 70 at the opposite end. A shank 72 extends axially between the head 68 and point 70. A pair of barbs 74 extend radially from the body 62 in the region of the point 70. Each barb 74 has a sloped entry surface 76 and a radial lock shoulder 78.

The spring 64 is a coil spring that is installed over the barbs 74 and around the shank 72. The spring 64 closely encircles the shank 72 and is captured between the lock shoulder 78 and an inner shoulder 80 of the head 68. A neck 82 at the transition of the head 68 and the shank 72 locates the spring 64 concentrically on the body 62.

A slot 84 extends diametrically through the shank 72 and point 70 and defines a pair of parallel, axially extending legs 86 and 88 spaced apart by the slot 84. The slot 84 extends perpendicular to a diameter line between the barbs 74, and one of the barbs 74 is located on each leg 86 and 88. Because of the characteristics of the molded plastic material of the body 62 and because of the slot 84, the legs 86 and 88 are flexible and permit the barbs 74 to resiliently flex radially inwardly.

A strut portion 90 joins the ends of the legs 86 and 88 and defines the end of the slot 84. The strut 90 prevents relative radial movement of the ends of the legs 86 and 88 and stiffens the legs while permitting deflection of the portions of the barbs 74 adjacent to the radial lock shoulders 78. As a result, the slot 84 is closed rather than open ended, and each leg flexes in the nature of a bridge fixed at both ends rather than as a cantilever beam free at one end.

The strut portion 90 is circular in shape and defines a blunt, circular end of the point 70. The circumference of the circular strut merges with the leading ends of the sloped barb surfaces 76. This configuration facilitates insertion of the point 70 into a mounting hole. There are no sharp ends and no free flexing leg ends to catch on a surface surrounding a mounting hole.

While the present invention has been described with reference to the details of the embodiment of the invention shown in the drawing, these details are not intended to limit the scope of the invention as claimed in the appended claims.

What is claimed is:

1. An assembly for cooling multiple electronic modules comprising:
   a circuit board, said circuit board including an array of vias extending between a top surface and a bottom surface of said circuit board,
   a first plurality of electrical modules mounted on the top surface of said circuit board;
   a second plurality of electrical modules mounted on the bottom surface of said circuit board,
   each of said first plurality of electrical modules and each of said second plurality of electrical modules including a plurality of leads, each lead of said first plurality of modules being attached to a top conductive region on the top surface of the circuit board, each lead of said second plurality of modules being attached to a bottom conductive region on the bottom surface of the circuit board, each said conductive region connected to one of the vias;
   a first metal heat sink and a second metal heat sink, said first metal heat sink aligned with the first plurality of modules, and said second metal heat sink aligned with the second plurality of modules;
   a plurality of mounting elements attaching said heat sinks together;
   a pair of thermally conductive elements respectively conducting heat from said modules to said heat sinks, a first of said pair of thermally conductive elements contacting the top surface of said first plurality of electrical modules mounted on the top surface of the circuit board and said first heat sink, and a second of said pair of thermally conductive elements contacting the top surface of said second plurality of electrical modules mounted on the bottom surface of the circuit board and said second heat sink; and
   said plurality of mounting elements comprising push pins; said push pins received through a plurality of aligned mounting holes in said heat sinks, said pair of thermally conductive elements and the circuit board.

2. The assembly of claim 1, said pair of thermally conductive elements comprising a pair of planar, conformable, elastic, electrically insulating and thermally conductive interface pads.

3. The assembly of claim 1, said pair of thermally conductive elements comprising an electrically insulating and thermally conductive, conformable, flowable material.

4. The assembly of claim 1, said push pins each including a body formed of a molded plastic material and having a push head at a first end, a point at the second end for insertion through the aligned mounting hole of said first heat sink, through the aligned mounting hole of said first of said pair of thermally conductive elements, through the aligned mounting hole of the circuit board, through the aligned mounting hole of said second of said pair of thermally conductive elements, and through the aligned mounting hole of said second heat sink and a shank between said push head and said point.

5. The assembly of claim 4 further comprising a coil spring captured around said shank and beneath said head for urging said first heat sink toward said second heat sink.

6. The assembly of claim 1, each said first metal heat sink and said second metal heat sink comprising a base and a plurality of outwardly extending fins.

7. The assembly of claim 6, said plurality of outwardly extending fins of said second metal heat sink comprising multiple outwardly extending plates oriented parallel to one another and parallel to a flow of cooling air.

8. The assembly of claim 6, said plurality of outwardly extending fins of said first metal heat sink comprising multiple outwardly extending posts arranged so that air flow is permitted through said plurality of outwardly extending posts in multiple directions.

9. The assembly of claim 1, said modules comprising multiple static random access memory (SRAM) modules.

10. An assembly for cooling multiple electronic modules comprising:
    a circuit board, said circuit board including an array of vias extending between a top surface and a bottom surface of said circuit board,
    a first plurality of electrical modules mounted on the top surface of said circuit board,
    a second plurality of electrical modules mounted on the bottom surface of a circuit board
    a first thermally conductive material contacting the top surface of said first plurality of electrical modules mounted on the top surface of said circuit board;
    a second thermally conductive material contacting the top surface of said second plurality of electrical modules mounted on the bottom surface of said circuit board;
    a first heat sink engaging said first thermally conductive material for conducting heat from said first plurality of electrical modules mounted on the top surface of said circuit board;
    a second heat sink engaging said second thermally conductive material for conducting heat from said second plurality of electrical modules mounted on the bottom surface of said circuit board; and
    a pair of mounting elements attaching said first and said second heat sinks together; said mounting elements comprising push pins; said push pins received through a plurality of aligned mounting holes in said heat sinks, said thermally conductive materials and said circuit board.

11. The assembly as recited in claim 10, each of said first and said second thermally conductive material comprising an electrically insulating and thermally conductive, conformable, flowable material.

12. The assembly as recited in claim 10, each of said first and said second thermally conductive material comprising a planar, conformable, elastic, electrically insulating and thermally conductive interface pad.

13. The assembly as recited in claim 10, each of said first and said second heat sinks comprising a base and a plurality of outwardly extending fins.

* * * * *